United States Patent
Cameron et al.

(10) Patent No.: US 7,326,518 B2
(45) Date of Patent: Feb. 5, 2008

(54) PHOTORESIST COMPOSITIONS

(75) Inventors: James F. Cameron, Cambridge, MA (US); Dong Woo Lee, Shrewsbury, MA (US); Peter Trefonas, III, Medway, MA (US); Gary J. Swanson, Bellingham, MA (US); Jin Wuk Sung, Northborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/287,104

(22) Filed: Nov. 23, 2005

(65) Prior Publication Data

US 2006/0172224 A1 Aug. 3, 2006

Related U.S. Application Data

(60) Provisional application No. 60/631,220, filed on Nov. 24, 2004.

(51) Int. Cl.
G03C 1/492 (2006.01)
G03C 1/494 (2006.01)
G03C 1/76 (2006.01)
G03C 5/00 (2006.01)

(52) U.S. Cl. .................. 430/270.1; 430/905; 430/910; 430/913; 430/326

(58) Field of Classification Search ............. 430/270.1, 430/329, 905, 910, 913
See application file for complete search history.

(56) References Cited

U.S. PATENT DOCUMENTS

| | | | |
|---|---|---|---|
| 6,479,211 B1 | 11/2002 | Sato et al. | |
| 6,783,912 B2 * | 8/2004 | Cameron et al. | ........... 430/170 |
| 2003/0232273 A1 * | 12/2003 | Adams et al. | ........... 430/270.1 |
| 2003/0235781 A1 | 12/2003 | Shida et al. | |
| 2004/0253535 A1 * | 12/2004 | Cameron et al. | ........ 430/270.1 |
| 2004/0265754 A1 * | 12/2004 | Barclay et al. | ............. 430/322 |

FOREIGN PATENT DOCUMENTS

EP  1 172 384  1/2002

\* cited by examiner

*Primary Examiner*—Geraldina Visconti
(74) *Attorney, Agent, or Firm*—Peter F. Corless; Darryl P. Frickey; Edwards Angell Palmer Dodge LLP

(57) ABSTRACT

Chemically-amplified positive photoresist compositions are provided that contain a resin that comprises acetal and alicyclic groups. Photoresists of the invention can exhibit notably enhanced lithographic properties. Preferred photoresists of the invention comprise one or more photoacid generator compounds and one or more phenolic resins comprise one or more photoacid-labile acetal groups and one or more alicyclic groups such as adamantyl.

15 Claims, No Drawings

PHOTORESIST COMPOSITIONS

BACKGROUND OF THE INVENTION

1. Field of the Invention

The invention relates to chemically-amplified positive photoresist compositions that contain a resin that comprises acetal and alicyclic groups. Photoresists of the invention can exhibit notably enhanced lithographic properties. Preferred photoresists of the invention comprise one or more photoacid generator compounds and one or more phenolic resins that comprise a substituent that contains in covalent linkage one or more photoacid-labile acetal groups and one or more alicyclic groups such as adamantyl.

2. Background

Photoresists are photosensitive films for transfer of images to a substrate. They form negative or positive images. After coating a photoresist on a substrate, the coating is exposed through a patterned photomask to a source of activating energy such as ultraviolet light, EUV, e-beam, etc. to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Chemically-amplified positive-acting photoresist compositions have involved cleavage of certain "blocking" groups pendant from a photoresist binder, or cleavage of certain groups that comprise a photoresist binder backbone, which cleavage a polar functional group is provided, e.g., carboxyl, phenol or imide, which results in different solubility characteristics in exposed and unexposed areas of the resist coating layer. See, for example, U.S. Pat. Nos. 5,075,199; 4,968,851; 4,883,740; 4,810,613; and 4,491,628, and Canadian Patent Application 2,001,384.

One approach to enhance photoresist lithographic performance of chemically-amplified positive photoresists has been to use one or more modified resin components. See, for instance, U.S. Pat. Nos. 6,042,997 and 6,492,086 and U.S. Patent Publications 20020012869, 20030232273 and 20040002017. See also U.S. Pat. No. 6,312,870 and U.S. Patent Publications 200301946643, 20030224289 and 20040034160; U.S. Pat. No. 6,312,870; Malik et al., Lithographic Properties of Novel Acetal-Derivatized Hydroxy Styrene Polymers, SPIE Proceedings, vol. 3678 pages 388-400 (1999); Uetani et al., Standard Developer Available ArF resist and Performance, SPIE Proceedings, vol. 3333 (pages 546-553; Fujimori et al., Structural design of a new class of acetal polymer or DUV resists, SPIE Proceedings, vol.3999, pages 579-590 (2000). See also T. Hojo et al., Journal of Photopolymer Science and Technology, 16(3):455-458 (2003).

While currently available photoresists are suitable for many applications, current resists also can exhibit significant shortcomings, particularly in high performance applications such as formation of highly resolved sub-quarter micron features.

For example, certain prior deblocking positive photoresists have contained resin components where a substantial mass of the resist resin undergoes a cleavage reaction which can cause significant shrinkage of the resist coating layer areas exposed to activating radiation. Such shrinkage can compromise resolution of the image patterned in the photoresist coating layer.

In addition to such undesired resist layer shrinkage, photoacid-induced of resist component(s) also can result in problems with outgassing of volatile cleavage reaction products. In particular, volatile photoacidolysis products can deposit on lens elements of exposure tools and degrade those tools, or require regular maintenance.

Prior photoresists also have exhibited deficiencies upon post-development processing of the substrate coated with the developed resist relief image. In particular, problems can arise upon etching a bared substrate surface defined by a developed resist relief image. For instance, to etch aluminum, silicon oxide and other substrates rather stringent conditions are often employed. Chlorine and fluorine-based gas etchants are frequently used and extensive localized heating often occurs during the etching sequence. As a consequence, the patterned photoresist coating on the substrate can experience shrinkage or other degradation. Such degradation can reduce resolution of the feature etched into the substrate and even render the substrate unusable for its intended purpose.

It thus would be desirable to have new photoresist compositions. It would be particularly desirable to have new photoresist compositions that could exhibit enhanced lithographic performance.

SUMMARY OF THE INVENTION

We now provide new photoresist compositions that comprise one or more resins that comprise acetal and alicyclic groups as a covalently linked suibstituent.

Preferred photoresists of the invention comprise one or more photoacid generator compounds and one or more phenolic resins that comprise one or more photoacid-labile acetal groups and one or more alicyclic groups such as adamantyl.

Preferred photoresists of the invention comprise:
1) one or more photoacid generator compounds; and
2) a resin component that comprises one or more polymers that comprise
   i) phenolic groups,
   ii) aromatic groups such as phenyl groups that comprise one or more substituents that contain in covalent linkage alicyclic groups and one or more photoacid-labile acetal groups. By reference to covalent linkage, it is intended that the alicyclic group(s) and photoacid-labile acetal group(s) may be separated by a suitable linker such as optionally substituted alkylene such as $-CH_2)_{1-4}$- or the like, or alternatively the alicyclic group(s) and photoacid-labile acetal group(s) may be directly linked by a chemical bond (i.e. no interposing linker group).

Additional preferred photoresists of the invention comprise:
1) one or more photoacid generator compounds; and
2) a resin component that comprises one or more terpolymers or other higher order polymers such as tetrapolymers that comprise
   i) phenolic groups,
   ii) aromatic groups such as phenyl groups that are not substituted with carboxy or hydroxy groups, and
   iii) aromatic groups such as phenyl groups that comprise one or more substituents that comprise in covalent linkage one or more alicyclic groups and one or more photoacid-labile acetal groups.

We have found that preferred photoresist compositions of the invention can exhibit inter alia enhanced resistance to oxide-based etchants, reduced chemical outgassing during exposure and post-exposure bake processing, and improved resolution of the developed resist relief image.

Photoacid-labile resins of resists of the invention include one or more alicyclic groups such as adamantyl, cyclohexyl, cyclopentyl, norobornyl, and the like. Alicyclic groups that include a plurality of ring groups fused or otherwise covalently linked are often preferred and may suitably comprise 2, 3 or 4 or more cyclic groups. Adamantyl groups are particularly suitable for many systems.

Photoacid-labile resins of the invention also comprise one or more acetal photoacid-labile groups. As referred to herein, the term acetal group or other similar term as its recognized meaning and is inclusive of ketals and may include groups e.g. of the formula >C(ORR')$_2$ where R and R' are the same or different non-hydrogen substituent and groups of the formula —O—(CXY)—O—(CX'Y')$_n$—R, wherein X, Y, X', Y' are each independently a hydrogen or non-hydrogen substituent and one or more of X, Y, X' and Y' suitably may be e.g. an aromatic group such as phenyl, alkyl e.g. $C_{1-30}$ alkyl, alicyclic such as is a carbon alicyclic group e.g. optionally substituted adamantyl, and the like; n is 0 or a positive integer such as n is 0 (where no (CX'Y') groups are present) to 10; and R is ester, ether or non-hydrogen substituent such as those discussed above for X, Y, X'Y', or R is an ester or ether linked to such a non-hydrogen substituent such as optionally substituted aromatic e.g. optionally substituted phenyl or optionally substituted alicyclic such as optionally substituted adamantyl. As used herein, the term acetal is inclusive of the definition for acetal provided in the IUPAC Compendium of Chemical Terminology (Blackwell Science 1997) and includes ketal groups.

Photoacid-labile resins of the invention also may contain other moieties. For example, resins may contain nitrile units, or additional contrast enhancing groups such as an acid (—COOH) group and the like.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions. The invention includes photoresists that can be imaged at a wide range of wavelengths, including sub-300 nm such as 248 nm and 193 nm as well as EUV, e-beam, X-ray and the like.

The invention also provides the disclosed photoacid-labile polymers.

The invention further provides articles of manufacture comprising substrates such as a microelectronic wafer or a flat panel display substrate having coated thereon the photoresists and relief images of the invention.

Other aspects of the invention are disclosed infra.

DETAILED DESCRIPTION OF THE INVENTION

As discussed above, we now provide new photoresist compositions that comprise one or more photoacid-labile resins that comprise one or more substituents that comprise one or more photoacid-labile acetal groups with one or more alicyclic substituents. Particularly preferred photoacid resins of the invention include phenolic terpolymers.

More particularly, preferred photoresist resins of the invention include polymers that comprise a structure corresponding to the following Formula (I):

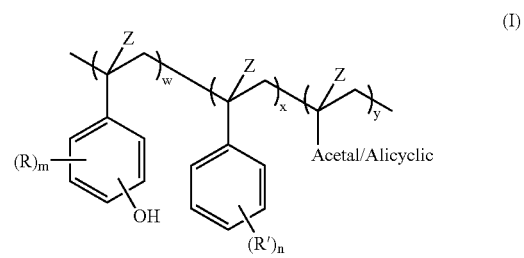

wherein:

R is a non-hydrogen substituent such as halogen (F, Cl, Br, and/or I), optionally substituted $C_{1-20}$ alkyl, optionally substituted hetero $C_{1-20}$ alkyl particularly optionally substituted $C_{1-20}$ alkoxy, and the like;

$R^1$ is a non-hydrogen substituent that does not include a hydroxy or carboxy (—COOH) group;

Acetal/Alicyclic is a substituent that includes both i) one or more photoacid-labile acetal groups such as those acetal groups of the above discussed formula and ii) one or more alicyclic groups such as a carbon alicyclic group having from 3 to about 50 carbon atoms and 1 to 2, 3 or 4 or more fused or otherwise covalently linked rings such as cyclopentyl, cyclohexyl, adamantyl, norbornyl, isobornyl, etc., with adamantyl being preferred for many systems;

each Z is independently hydrogen or optionally substituted $C_{1-6}$ alkyl such as methyl and preferably each Z is hydrogen or methyl;

m is an integer of from zero (where the phenyl ring contains a single hydroxy substituent) to 4;

n is an integer of from zero (where the phenyl ring does not contain any non-hydrogen ring substituents) to 5;

w, x and y are mole percents of the respective polymer units based on total units of the polymer and each of w, x and y are greater than zero.

Preferred for many resist systems are resins that contain minimal phenyl ring substitution such as where valences m and n of the above Formula (I) are each independently zero or one, including polymers that comprise a structure corresponding to the following Formula (II):

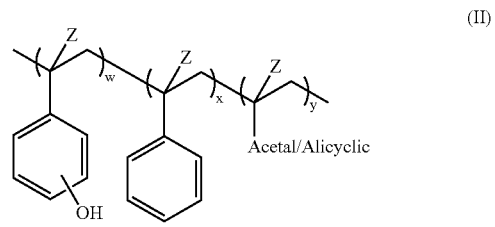

wherein:

Acetal/Alicyclic, each Z, w, x and y are the same as defined in Formula (I) above.

Also preferred for many resist systems are resins that comprise one or more Acetal/Alicyclic photoacid-labile substituents that comprise one or more ester moieties as well as one or more photoacid-labile acetal groups. For instance, preferred are polymers that comprise a structure corresponding to the following Formula (III):

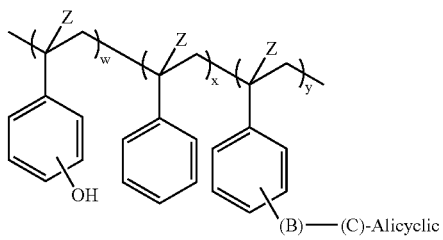

(III)

wherein:

each Z, w, x and y are the same as defined in Formula (I) above;

B is a chemical bond or a branched optionally substituted alkyl group preferably containing 2 to 20 carbon atoms such as >CHC$_{1-10}$ alkyl including >CHCH$_3$;

C is an acetal group optionally linked together with a straight chained or branched optionally substituted alkyl such as —(CH2)$_k$- where k is an integer of from 1 to 6 more typically 1 to 4; and Alicyclic is an alicyclic group such as a carbon alicyclic group having from 3 to about 50 carbon atoms and 1 to 2, 3 or 4 or more fused or otherwise covalently linked rings such as cyclopentyl, cyclohexyl, adamantyl, norbornyl, isobornyl, etc., with adamantyl being preferred for many systems.

Suitable amounts of various units of preferred photoacid-labile polymers of the invention suitably may vary. In general, in preferred polymers of the invention, polymer units that comprise photoacid-labile acetal groups (valence y in above Formulae (I) through (III) will be present from about 1 to 80 mole percent of total polymer units, and more typically polymer units that comprise photoacid-labile acetal groups will be present in an amount of at least 3, 5, 8, 10, 12 or 15 mole percent based on total polymer units. To maximize resolution of a developed resist relief image, it is generally preferred that a polymer contain no more than about 50, 40, 30, 25 or even 20 mole percent of units that contain photoacid-labile acetal groups.

In general, in preferred polymers of the invention, polymer units that comprise phenolic (e.g. —C$_6$H$_4$OH) groups (valence w in above Formulae (I) through (III)) will be present from about 20 to 85 mole percent of total polymer units, and more typically polymer units that comprise phenolic groups will be present in an amount of 30 to 80 mole percent based on total polymer units. To maximize resolution of a developed resist relief image, it is generally preferred that a polymer contain about 60 to 80 mole percent or 65 to 75 or 80 mole percent phenol units based on total polymer units.

In general, in preferred polymers of the invention, polymer units that comprise phenyl groups that are not substituted by hydroxy or carboxy (e.g. —C$_6$H$_5$) groups (valence x in above Formulae (I) through (III)) will be present from about 3 to 50 mole percent of total polymer units, and more typically polymer units that comprise such unsubstituted phenyl groups will be present in an amount of 5 to 40 mole percent based on total polymer units. To maximize resolution of a developed resist relief image, it is generally preferred that a polymer contain about 15 to 30 mole percent or 10 to 20 or 30 mole percent phenyl units based on total polymer units.

Generally preferred photoacid-labile resins of the invention have low polydispersity (Mw/Mn) values, particularly 2 or less, more preferably 1.5, 1.3 or 1.2 or less. References herein to polydispersity values are as determined by gel permeation chromatography.

Exemplary specifically preferred photoacid-labile resins of the invention include the following:

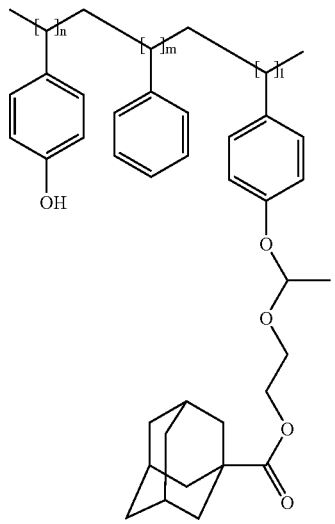

Photoacid-labile polymers of the invention can be readily produced by known synthetic methods. For instance, a preformed phenolic polymer may be reacted with a vinyl ether compound suitably in the presence of an acid catalyst to provide a photoacid-labile polymer of the invention. The vinyl ether reagent suitably non-aromatic and e.g. contain one or more alicyclic groups such as adamantyl, cyclohexyl and the like. The vinyl ether reagent also may contain one or more aromatic groups such as phenyl, naphthyl or acenaphthyl.

Preferred phenolic polymers on which an acetal/alicyclic group may be grafted into phenolic/phenyl copolymers which may be provided e.g. by copolymerizing a vinyl phenol compound and a styrene compound. Phenolic polymers including phenolic/styrene copolymers also are commercially available. The vinyl ether compound may be grafted onto a portion of the available phenolic —OH groups to provide pendant acetal/alicyclic groups.

See Example 1 which follows for an exemplary preferred synthesis of a photoacid-labile resin of the invention.

As discussed above, photoresists of the invention typically contain a resin component and a photoactive component. A photoresist composition of the invention will comprise at least one polymer with alicyclic groups and photoacid-labile acetal groups. Preferably the resin component is used in a resist composition in an amount sufficient to render the resist developable with an aqueous alkaline solution.

Photoresists of the invention also contain a photoactive component, which preferably comprises one or more photoacid generator compounds (PAGs). Preferred PAGS can be photoactivated by exposure radiation having a wavelength of 248 nm, 193 nm, EUV, e-beam, IPL, x-ray and the like. The one or more photoacid generator compounds may be suitably in a photoresist composition in an amount sufficient to generate a latent image in a coating layer of the resist upon exposure to activating radiation. Preferred PAGs for use in photoresists of the invention include imidosulfonates such as compounds of the following formula:

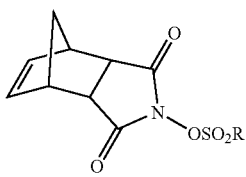

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Onium salts also preferred PAGs for use in photoresists of the invention, including iodonium and sulfonium compounds, which may be complexed with various anions including to form sulfonate salts. Two suitable PAGs use in photoresists of the invention are the following PAGS 1 and 2:

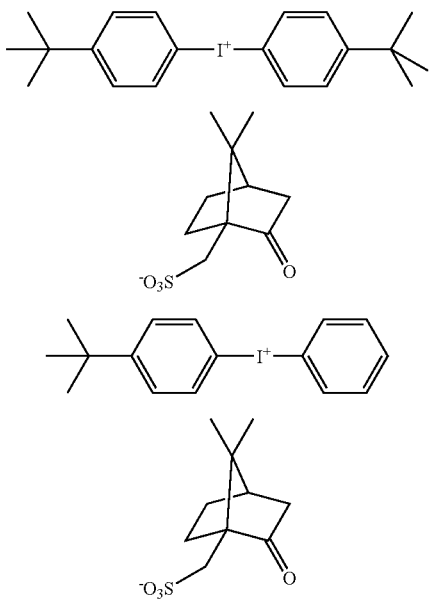

Such iodonium compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention.

In addition to the above described phenolic polymers with acetal and alicyclic groups, photoresists of the invention may comprise one or more additional resins. A preferred additional resin comprises phenolic groups optionally with ester and/or carbonate and/or acetal photoacid-labile groups.

More particularly, photoresists of the invention may optionally contain one or more additional resins selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, ethyl cyclopentyl(meth)acrylate, propylphenyl methacrylate, methyl adamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) a resin that contains repeat units that contain a hetero atom, particularly oxygen and/or sulfur, and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

3) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Also preferred are photoresists that contain a blend of one or more resins as disclosed herein. In particular, preferred are photoresists that contain a blend of resins where at least one resin contains ester photoacid labile group and another resin contains acetal photoacid labile groups.

Generally preferred additional polymers to employ in photoresists of the invention copolymer may suitably contain both phenolic and non-phenolic units. For example, one preferred group of such optional polymers has acid labile groups substantially, essentially or completely only on non-phenolic units of the copolymer, particularly alkylacrylate photoacid-labile groups, i.e. a phenolic-alkyl acrylate copolymer. One especially preferred optional polymer additional has repeating units x and y of the following formula:

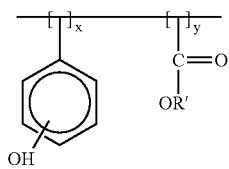

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-18}$ alkoxy, $C_{2-8}$ alkenyl, etc. The units x and y may be regularly alternating in the copolymer, or may be randomly interspersed through the polymer. Such polymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

As stated above including with reference to Formulae (I), (II) and (III), various materials including units of photoacid-labile polymers of the invention may be optionally substituted. A "substituted" polymer unit or other material may be suitably at one or more available positions, typically 1, 2 or 3 available positions by groups such as hydroxy, halogen, $C_{1-6}$alkyl, $C_{1-6}$alkoxy, $C_{1-6}$alkylthio, $C_{3-18}$cycloalkyl and the like.

Photoresists of the invention also optionally may contain other materials. For example, other optional additives include actinic and contrast dyes, anti-striation agents, plasticizers, speed enhancers, sensitizers, and the like. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, particularly tetramethylammonium hydroxide (TMAH) and tetrabutylammonium hydroxide (TBAH), or more particularly the lactate salt of tetrabutylammonium hydroxide, which can enhance resolution of a developed resist relief image. The added base is suitably used in relatively small amounts, e.g. about 1 to 10 percent by weight relative to the PAG, more typically 1 to about 5 weight percent. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

As discussed above, the resin component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz, glass or copper substrates may also be employed. Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. As discussed above, preferred exposure wavelengths include sub-300 nm such as 248 nm as well as other radiation energies such ass EUV, e-beam, IPL, x-ray and the like. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLE 1

Polymer Preparation

A styrene/hydroxystyrene copolymer is suitably prepared as follows. 4-Hydroxystyrene (17.50 g, 0.146 mol), and about a 0.25 molar equivalent of styrene (are were dissolved in 85 ml of isopropyl alcohol. The reaction solution is then deoxygenated by gently bubbling a stream of $N_2$ through the stirring solution for 20 minutes, and then placing it under a blanket of $N_2$. The polymerization solution is then brought to a gentle reflux. Azo-bis-2,2'-isobutyronitrile (AIBN) (0.48 g) dissolved in 5 ml of acetonitrile is, added to the gently refluxing mixture over 5 minutes. The polymerization is then refluxed with stirring for 24 hours. Upon completion of the polymerization the polymer is isolated by precipitation into water, filtered, washed well with water, and dried in a vacuum oven to provide a styrene/hydroxystyrene copolymer.

A reaction vessel is then charged with the styrene/hydroxystyrene copolymer the propylene glycol methyl ether acetate to provide a 20 weight percent solution. Traces of water are removed by azeotropic distillation. To the dried solution, 0.003 mole equivalent of trifluoroacetic acid catalyst and a target amount of vinyl ether having structure A immediately below to give a desired level of blocking are added. The reaction mixture is stirred at room temperature overnight and the polymer of the below structure 1 (poly(hydroxystyrene/styrene/ACVE blocked hydroxystyrene) is isolated by precipitation and washed well and dried in vacuum over to provide the polyhydroxystyrene/styrene/ACVE blocked hydroxystyrene terpolymer.

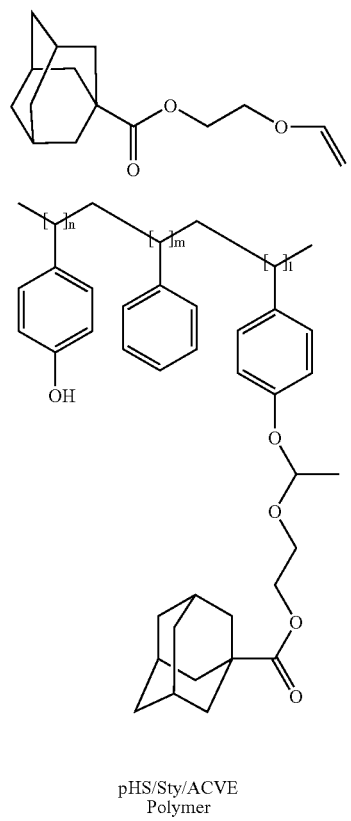

pHS/Sty/ACVE Polymer

EXAMPLE 2

Photoresist Preparation and Processing

Control Formulation 1

A first photoresist was prepared by admixing the following materials:
Polymer blend of poly(hydroxystyrene/EVE blocked hydroxystyrene/tBOC blocked hydroxystyrene and poly(hydroxystyrene/styrene/EVE blocked hydroxystyrene)
t-Butylphenyldiphenylsulfonium perfluorobutanesulfonate, 2.8 wt % of polymer
t-Butyldiazodisulfone, 2.0 wt % of polymer
Tetramethylammonium hydroxide, 0.183 wt % of polymer
Glycerol monolaurate, 3.0 wt % of polymer
Salicylic acid, 0.1 wt % of polymer
R-08 surfactant, 0.05 wt % of total solids
Propylene glycol monomethyl ether acetate (90%)/Ethyl lactate (10%)

Invention Formulation 1

A photoresist was prepared by admixing the same components as the above Control Formulation 1 but with the replacement of poly(hydroxystyrene/styrene/EVE blocked hydroxystyrene) with poly(hydroxystyrene/styrene/ACVE blocked hydroxystyrene (i.e. structure 1) as described in Example 1 above.

The photoresists of this Example 2 were processed as follows: The photoresists of this Example 3 (i.e. Control Formulation 1 and Invention Formulation 1) were processed as follows: the resist was spin coated over an organic antireflective coating composition on a microelectronic wafer, the coated photoresist layer softbaked at 110° C. for 60 seconds to a dried thickness of 2,400 A. The resist was image-wise exposed using annular illumination (0.80 NA, 0.85/0.65 sigma) on a DUV scanner at 248 nm. The resist was then post exposure baked at 110° C. for 60 seconds and the pattern developed in an aqueous alkaline developer solution for 60 seconds. The photoresist relief image produced with Invention Formulation 1 showed improved resolution relative to the photoresist relief image produced with Control Formulation 1.

EXAMPLE 2

Photoresist Preparation and Processing

Control Formulation 2

This photoresist composition was prepared by admixing the following materials:
Polymer blend of poly(hydroxystyrene/EVE blocked hydroxystyrene/tBOC blocked hydroxystyrene and poly(hydroxystyrene/EVE blocked hydroxystyrene)
t-Butylphenyldiphenylsulfonium camphorsulfonate, 3.0 wt % of polymer
t-Butyldiazodisulfone, 2.0 wt % of polymer
Tetramethylammonium hydroxide, 0.13 wt % of polymer
Glycerol monolaurate, 3.0 wt % of polymer
Salicylic acid, 0.1 wt % of polymer
R-08 surfactant, 0.05 wt % of total solids
Propylene glycol monomethyl ether acetate (90% )/Ethyl lactate (10%)

Invention Formulation 2

A photoresist was prepared by admixing the same components as the above Control Formulation 1 but with the replacement of poly(hydroxystyrene/styrene/EVE blocked hydroxystyrene) with poly(hydroxystyrene/styrene/ACVE blocked hydroxystyrene (i.e. structure 1) as prepared in Example 2 above. The photoresist relief image produced with Invention Formulation 2 showed improved resolution relative to the photoresist relief image produced with Control Formulation 2.

The foregoing description of the invention is merely illustrative thereof, and it is understood that variations and modifications can be effected without departing from the spirit or scope of the invention as set forth in the following claims.

What is claimed is:

1. A photoresist composition comprising:
   i) one or more photoacid generator compounds,
   ii) one or more resins that comprise a structure of the following Formula (I):

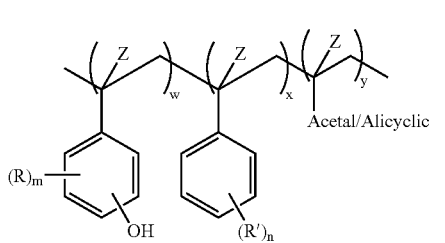

wherein:
R is a non-hydrogen substituent;
$R^1$ is a non-hydrogen substituent that does not include a hydroxy or carboxy group;
Acetal/Alicyclic is a substituent that includes both i) one or more photoacid-labile acetal groups and ii) one or more alicyclic groups;
each Z is independently hydrogen or optionally substituted $C_{1-6}$alkyl;
m is an integer of from 0 to 4; n is an integer of from 0 to 5; w, x and y are mole percents of the respective polymer units based on total units of the polymer and each of w, x and y are greater than zero.

2. The photoresist composition of claim 1 wherein the Acetal/Alicyclic substituent comprises one or more adamantyl groups.

3. The photoresist composition of claim 1 wherein the Acetal/Alicyclic substituent comprise one or more ester moieties and one or more photoacid-labile acetal groups.

4. The photoresist composition of claim 2 wherein the Acetal/Alicyclic substituent comprise one or more ester moieties and one or more photoacid-labile acetal groups.

5. The photoresist composition of claim 1 wherein the one or more resins comprise a structure corresponding to the following Formula (II):

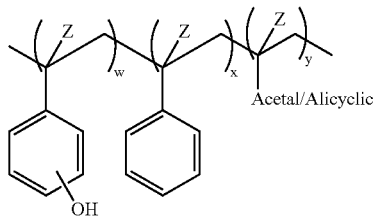

wherein:
Acetal/Alicyclic is a substituent that includes both i) one or more photoacid-labile acetal groups and ii) one or more alicyclic groups;
each Z is independently hydrogen or optionally substituted $C_{1-6}$alkyl; and
each of w, x and y are greater than zero.

6. The photoresist composition of claim 5 wherein the Acetal/Alicyclic substituent comprises one or more adamantyl groups.

7. The photoresist composition of claim 5 wherein the Acetal/Alicyclic substituent comprise one or more ester moieties and one or more photoacid-labile acetal groups.

8. The photoresist composition of claim 6 wherein the Acetal/Alicyclic substituent comprise one or more ester moieties and one or more photoacid-labile acetal groups.

9. The photoresist composition of claim 1 wherein the one or more resins comprise a structure corresponding to the following Formula (III):

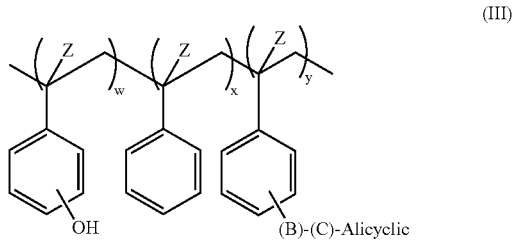

wherein:
each Z is independently hydrogen or optionally substituted $C_{1-6}$alkyl;
each of w, x and y are greater than zero;
B is a chemical bond or a branched optionally substituted alkyl group;
C is an acetal group optionally linked together with a straight chained or branched optionally substituted alkyl and
Alicyclic is a carbon alicyclic group having 1, 2, 3 or 4 or more fused or otherwise covalently linked rings.

10. The photoresist composition of claim 9 wherein the Alicyclic substituent comprises an adamantyl group.

11. A method for treating a substrate, comprising:
   applying a layer of a photoresist composition of claim 1 on a substrate surface; and
   exposing the photoresist layer to patterned radiation and developing the exposed photoresist composition layer.

12. The method of claim 11 wherein the photoresist layer is exposed to radiation having a wavelength of 248 nm.

13. A method for treating a substrate, comprising:
   applying a layer of photoresist composition of claim 5 on a substrate surface; and
   exposing the photoresist layer to patterned radiation and developing the exposed photoresist composition layer.

14. An article of manufacture comprising a substrate having coated thereon a photoresist composition of claim 1.

15. The article of claim 14 wherein the substrate is a micro electronic semiconductor wafer substrate.

* * * * *